(12) United States Patent
Kashiwakura

(10) Patent No.: US 9,265,149 B2
(45) Date of Patent: Feb. 16, 2016

(54) PRINTED WIRING BOARD AND METHOD FOR MANUFACTURING THE SAME

(75) Inventor: Kazuhiro Kashiwakura, Tokyo (JP)

(73) Assignee: NEC CORPORATION, Tokyo (JP)

( * ) Notice: Subject to any disclaimer, the term of this patent is extended or adjusted under 35 U.S.C. 154(b) by 982 days.

(21) Appl. No.: 13/442,423

(22) Filed: Apr. 9, 2012

(65) Prior Publication Data

US 2012/0233857 A1    Sep. 20, 2012

Related U.S. Application Data

(62) Division of application No. 12/557,371, filed on Sep. 10, 2009, now Pat. No. 8,309,863.

(30) Foreign Application Priority Data

Sep. 18, 2008 (JP) ................................. 2008-239675

(51) Int. Cl.
| | |
|---|---|
| H05K 3/00 | (2006.01) |
| H01R 43/00 | (2006.01) |
| H05K 3/36 | (2006.01) |
| H05K 1/11 | (2006.01) |
| H05K 1/02 | (2006.01) |
| H05K 3/42 | (2006.01) |

(52) U.S. Cl.
CPC .............. *H05K 1/116* (2013.01); *H05K 1/0222* (2013.01); *H05K 1/0251* (2013.01); *H05K 3/429* (2013.01); *H05K 2201/09618* (2013.01); *H05K 2201/09718* (2013.01); *Y10T 29/49124* (2015.01); *Y10T 29/49155* (2015.01)

(58) Field of Classification Search
CPC .................. Y10T 29/49124; Y10T 29/49117; Y10T 29/49126; H01L 2924/01079; H01L 2924/01078; H02G 1/1256

USPC ............................ 29/829, 825, 830; 174/261
See application file for complete search history.

(56) References Cited

U.S. PATENT DOCUMENTS

| | | | | |
|---|---|---|---|---|
| 7,149,090 B2* | 12/2006 | Suzuki et al. | ................. | 361/762 |
| 8,097,815 B2* | 1/2012 | Watanabe | ..................... | 174/266 |
| 8,309,863 B2* | 11/2012 | Kashiwakura | ................ | 174/261 |
| 2002/0084312 A1* | 7/2002 | Shier et al. | ............... | 228/180.22 |
| 2003/0047348 A1* | 3/2003 | Jessep et al. | .................. | 174/250 |
| 2008/0277152 A1* | 11/2008 | Watanabe | ..................... | 174/262 |
| 2010/0065321 A1* | 3/2010 | Kashiwakura | ................ | 174/261 |
| 2011/0110061 A1* | 5/2011 | Leung | ........................... | 361/783 |

FOREIGN PATENT DOCUMENTS

JP    2000216510    * 4/2000

* cited by examiner

*Primary Examiner* — David Angwin

(57) ABSTRACT

A printed wiring board comprises ground layers stacked via insulator(s); a first through hole; second through holes ; and signal wirings each extending from the first through hole through the clearance between predetermined ones of the ground layers, disposed between predetermined second through holes of the second through holes. Each of first clearances in the ground layers neighboring layer in which the signal wiring is disposed has an outline that a distance between the first through hole and outline of the first clearance is minimum of the signal wiring. Each of second clearances in the ground layers not adjacent to the signal wiring has an outline formed outside a circle connecting each center of second through holes centering the first signal through hole, such that outline of second clearance does not contact with the second through holes.

1 Claim, 10 Drawing Sheets

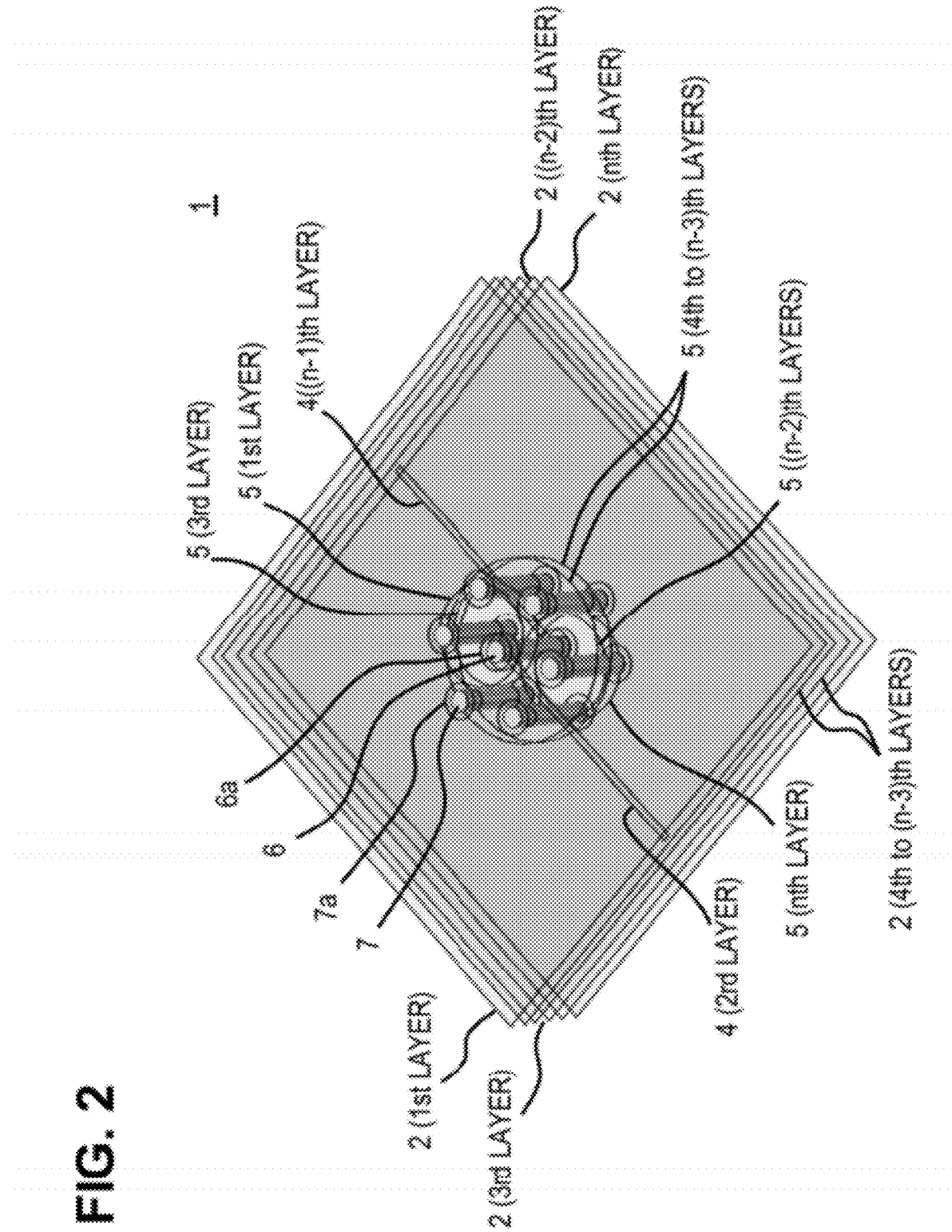

SECTIONAL VIEW
OF GND LAYER ABOVE
SIGNAL WIRING LAYER

SECTIONAL VIEW
OF SIGNAL WIRING LAYER

SECTIONAL VIEW
OF GND LAYER BELOW
SIGNAL WIRING LAYER

FIG. 6   COMPARATIVE CASE

PRINTED WIRING BOARD AND METHOD FOR MANUFACTURING THE SAME

REFERENCE TO RELATED APPLICATION

This is a divisional application of U.S. patent application Ser. No. 12/557,371 filed Sep. 10, 2009 now U.S. Pat. No. 8309863 and claims the benefit of its priority.

TECHNICAL FIELD

The present invention relates to a printed wiring board and a method for manufacturing the same, and in particular, to a printed wiring board having through holes for high-speed signal transmission and a method for manufacturing the same.

BACKGROUND

Throughput of communication devices or information devices is being improved dramatically. In recent years, frequencies of signals transmitted in or between such devices are being increased, and there is a possibility that deterioration of a signal bandwidth in a printed wiring board may be caused. In particular, deterioration of a signal bandwidth in a through hole in a printed wiring board with a multilayer wiring structure is problematic in improving the throughput. Thus, as a means of reducing deterioration of a signal bandwidth in a printed wiring board, the following techniques have been suggested.
Patent Document 1:
    JP Patent Kokai Publication No. JP2000-216510A
Patent Document 2:
    JP Patent Kokai Publication No. JP2001-244633A
Patent Document 3:
    JP Patent Kokai Publication No. JP2007-158675A
Patent Document 4:
    JP Patent Kokai Publication No. JP2007-220849A
Patent Document 5:
    JP Patent Kokai Publication No. JP2007-234715A
Patent Document 6:
    JP Patent Kokai Publication No. JP2008-130976A
Patent Document 7:
    JP Patent Kokai Publication No. JP2007-250885A
Patent Document 8:
    JP Patent Kokai Publication No. JP2007-258358A
Patent Document 9:
    JP Patent Kokai Publication No. JP2000-114729A

SUMMARY

The entire disclosures of Patent Documents 1-9 are incorporated herein by reference thereto. The following analyses are given by the present invention.

For example, Patent Document 1 discloses a printed wiring board in which ground wirings and a signal wiring are formed in the board, a signal-wiring through hole is connected to the signal wiring, a plurality of ground-wiring through holes arranged parallel to the signal-wiring through hole are formed around the signal-wiring through hole, and the ground-wiring through holes are connected to the ground wirings. By increasing and reducing the number of the ground-wiring through holes, the value of capacitance formed between the signal-wiring through hole and the ground-wiring through holes is adjusted, and impedance matching between a connector and the printed wiring board is achieved. However, clearances between the signal-wiring through hole and the ground wirings (planar* solid conductor) are not defined. Thus, transmission characteristics of the through holes might be deteriorated regardless of the size of the clearances.
[*Definition: "planar" means—continuous-in-two-dimensional directions—]

Additionally, Patent Document 2 discloses a multilayer printed circuit board, and in order to suppress coupling between a signal through hole and a power supply or GND solid conductor layer in the multilayer printed circuit board, clearances are enlarged or the center of a clearance circle of an adjacent power supply or GND solid conductor layer in which another signal is disposed is shifted. In this way, impedance matching with other signals is considered. Around a signal wiring extending from the signal through hole, in order to avoid impedance mismatching with other signals, the diameter of a clearance is made smaller, instead of shifting the center of the clearance. However, when capacitive coupling between the signal through hole and a solid planar conductor layer is generated at the clearance circle with a small diameter, impedance mismatching may be caused.

It is a primary object of the present invention to provide a printed wiring board that can improve transmission characteristics of through holes and a method for manufacturing the same.

In a first aspect of the present invention, there is provided a printed wiring board comprising: a plurality of ground layers stacked via insulator(s); a first through hole; a plurality of second through holes formed at predetermined positions along a circle concentric with a center axis of the first through hole; clearances, each forming an anti-pad, provided in an area between the first through hole and each of the ground layers; and signal wirings each extending from the first through hole, through the clearance between predetermined ones of the ground layers, and disposed between predetermined second through holes of the second through holes. Among the clearances, the outline of each of first clearances in the ground layers one layer higher and one layer lower than a layer in which the signal wiring is disposed is formed such that a distance between the first through hole and the outline of each of the first clearances is minimum in a direction in which the signal wiring extends from the first through hole. Further, among the clearances, the outline of each of second clearances in the ground layers that are not adjacent to the signal wiring is formed outside a circle established by connecting each center of the second through holes centering at the center axis of the first through hole, such that the outline of each of the second clearances does not contact with the second through holes. The second through holes are not connected to the ground layers that are not adjacent to the signal wiring but are connected to the ground layer one layer higher and one layer lower than the layers in which the signal wiring is disposed.

In a second aspect of the present invention there is provided a method for manufacturing a printed wiring board. The method comprises: forming a first ground layer having a first opening; forming a signal wiring having a land disposed at a position eccentrically with respect to a center of the first opening and extending from the land in a direction of the nearest outline part of the first opening on the first ground layer via an insulator; forming a second ground layer having a second opening at a position similar to that of the first opening and having a shape similar to that of the first opening on the signal wiring via an insulator; forming a third ground layer having a third opening larger than the second opening and having the same center as the land on the second ground layer via an insulator. The method further comprises: forming a first penetration hole penetrating the land; forming second penetration holes disposed along a circle concentric with a center axis of the first opening and penetrating the first and the second ground layers without coming into contact with the signal wiring and the third ground layer; and forming a first through hole and second through holes in the first and second penetration holes, respectively.

The meritorious effects of the present invention are summarized as follows.

Based on the printed wiring board of the present invention, clearances that have been a cause for degrading signal transmission characteristics are improved, and thus, high-quality, high-speed signal transmission is achieved. Namely, by forming (disposing) the second through holes in a concentric fashion around the first through hole, the characteristic impedance is controlled. Further, by forming the clearances in the ground layers that are not adjacent to the signal wiring(s) outside the second through holes, electromagnetic coupling is inhibited. Furthermore, by shifting the center of each of predetermined clearances, mismatching of the characteristic impedance of the signal wirings is inhibited. Therefore, signal transmission characteristics are improved. In addition, even when through holes have to be used in high-density multilayer wirings, matching of the characteristic impedance of the signal wirings and reduction of insertion loss are achieved, and therefore, products can be designed without deterioration of characteristics.

BRIEF DESCRIPTIONS OF THE DRAWINGS

FIG. 2 is a partially perspective view illustrating an example of the structure of conducting parts around the through holes of the printed wiring board according to the example 1 of the present invention.

Figure 3A:
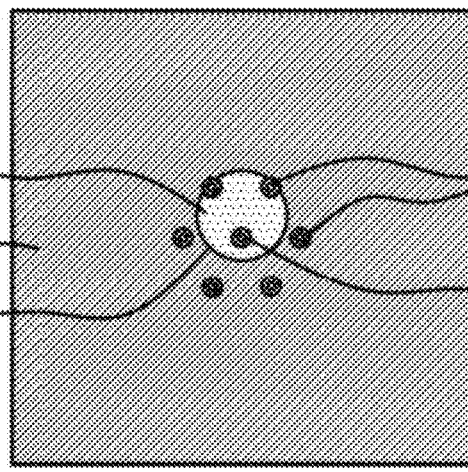
Figure 3B:
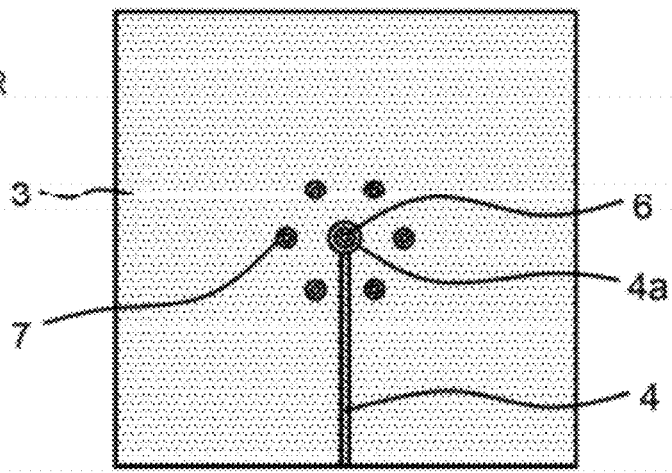
Figure 3C:
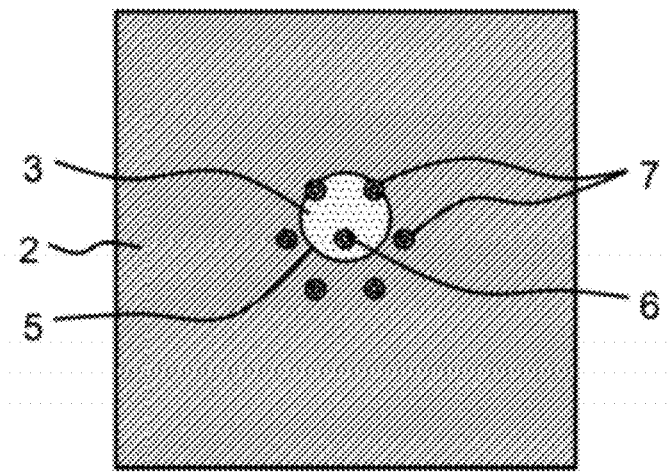

FIGS. 3A, 3B, and 3C schematically illustrate an example of the structure of the printed wiring board according to the example 1 of the present invention: FIG. 3A is a sectional view illustrating a GND layer above a signal wiring; FIG. 3B is a sectional view illustrating the signal wiring layer; and FIG. 3C is a sectional view illustrating a GND layer below the signal wiring.

Figure 4:
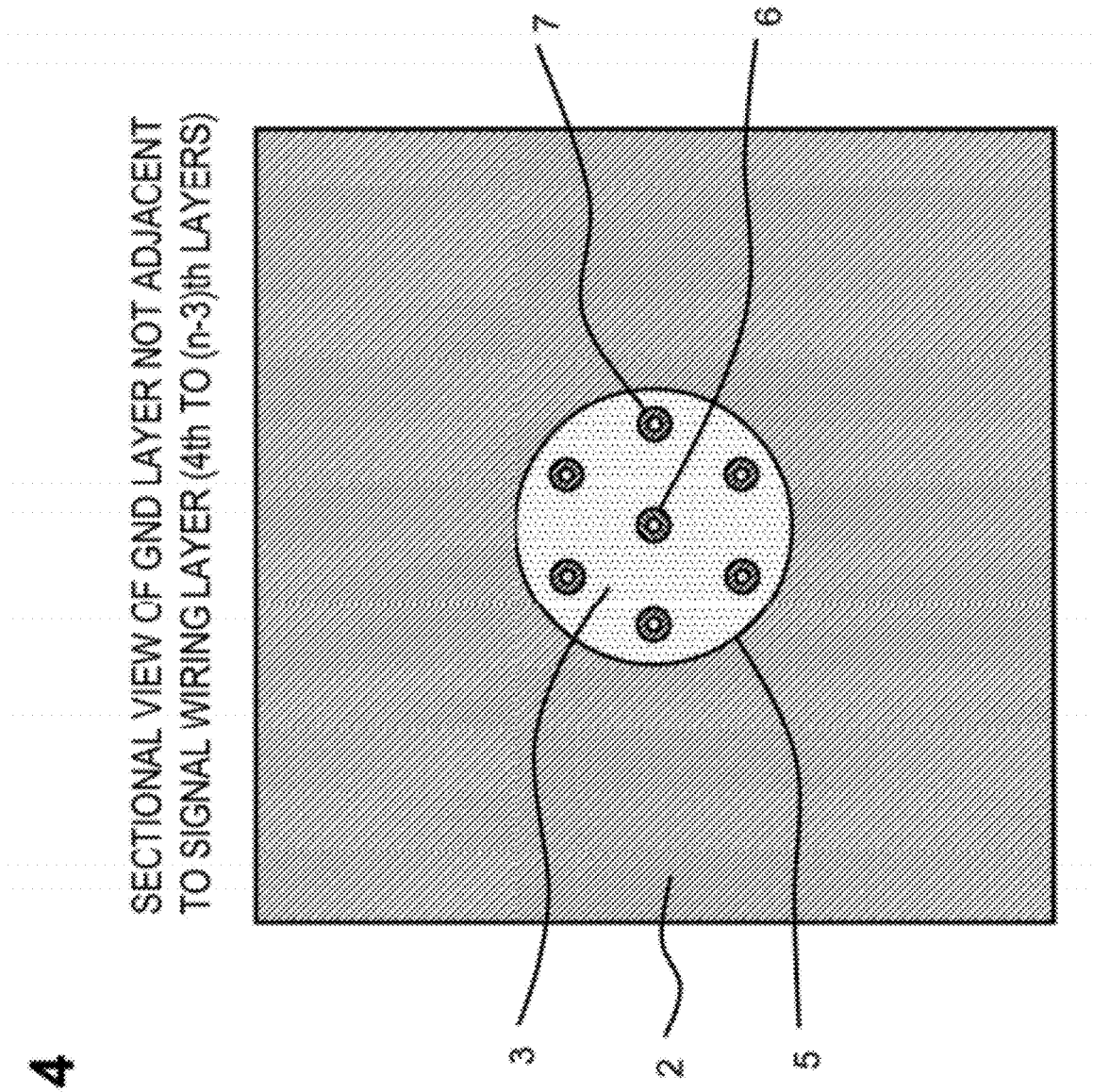

FIG. 4 schematically illustrates an example of the structure of the printed wiring board according to the example 1 of the present invention, illustrating a sectional view of a GND layer that is not adjacent to the signal wiring layer.

Figure 5:
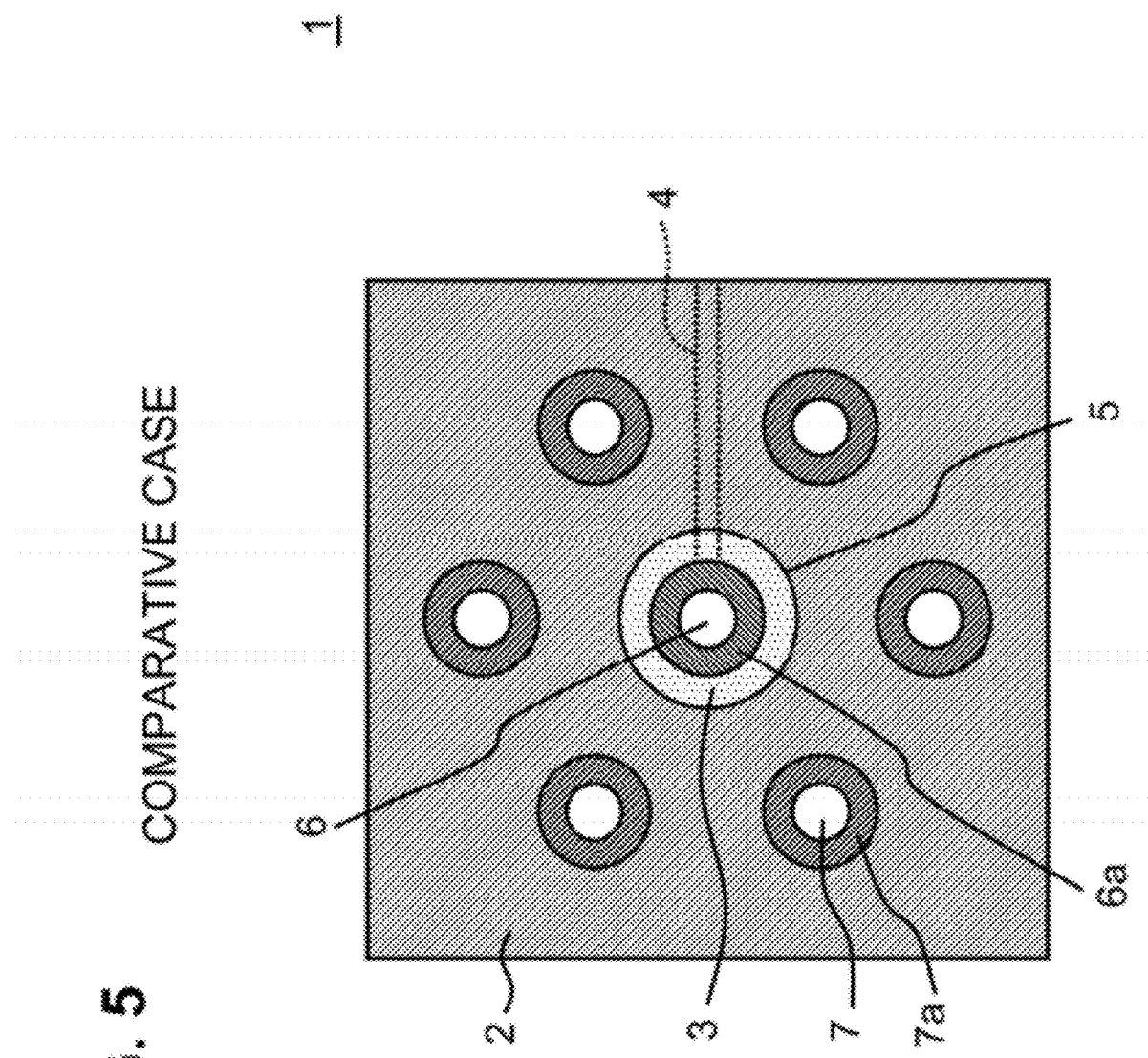

FIG. 5 is a schematic partial plan view illustrating an example of the structure around through holes of a printed wiring board according to a comparative example 1, seen from a first GND layer of the printed wiring board.

Figure 6:
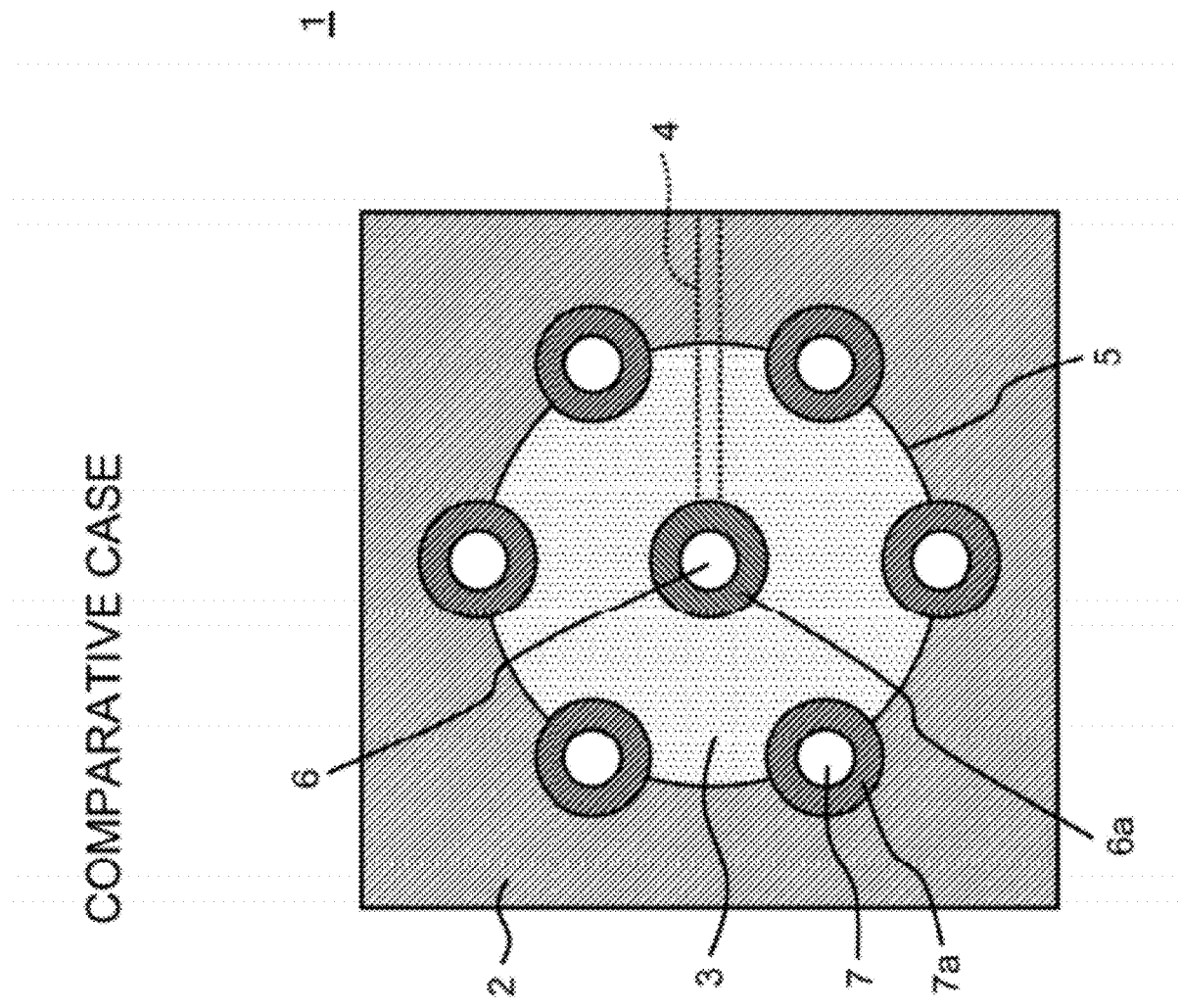

FIG. 6 is a schematic partial plan view illustrating an example of the structure around through holes of a printed wiring board according to a comparative example 2, seen from a first GND layer of the printed writing board.

Figure 7:
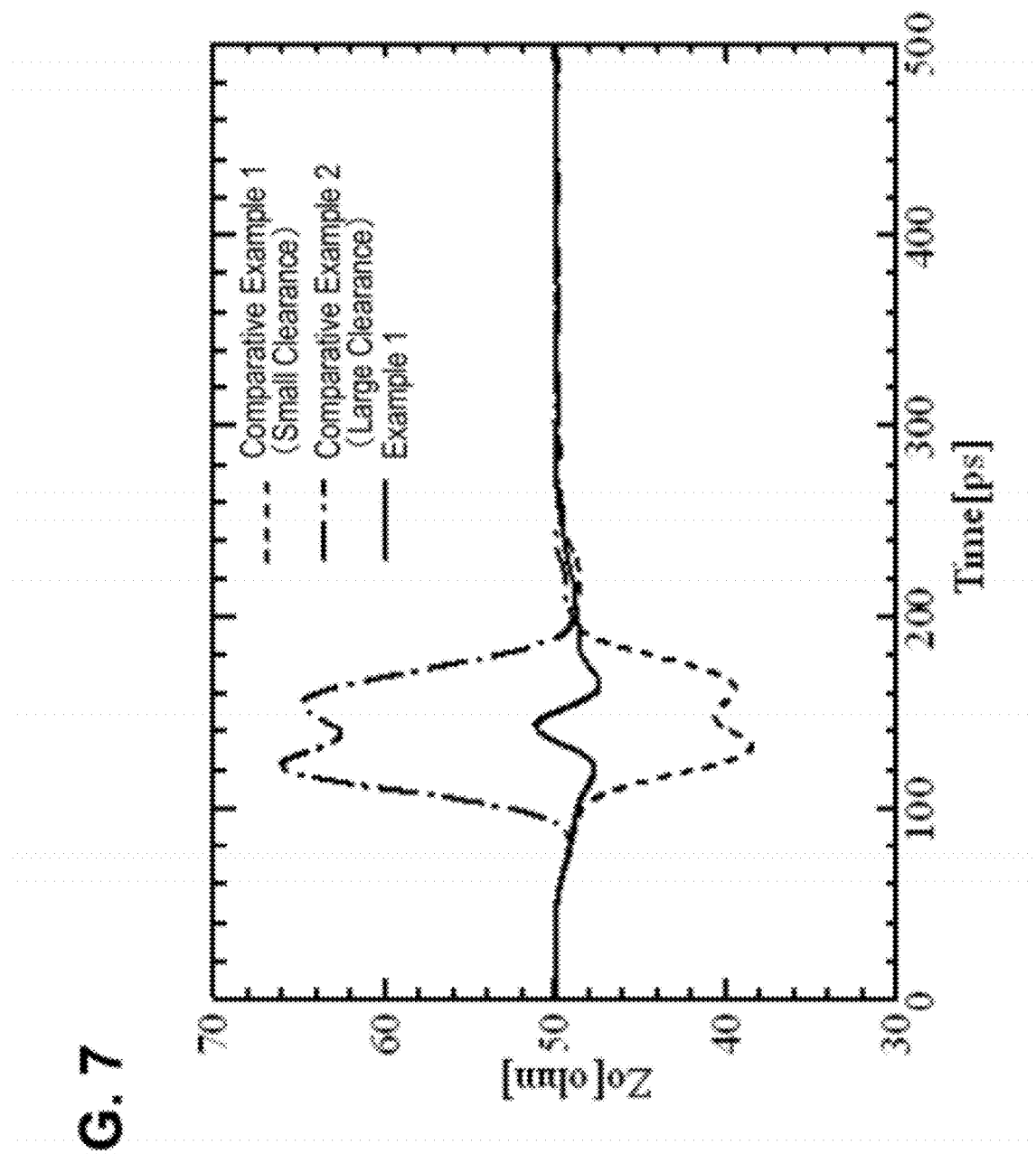

FIG. 7 is a graph illustrating characteristic impedance of each of the example 1, the comparative example 1, and the comparative example 2.

Figure 8:
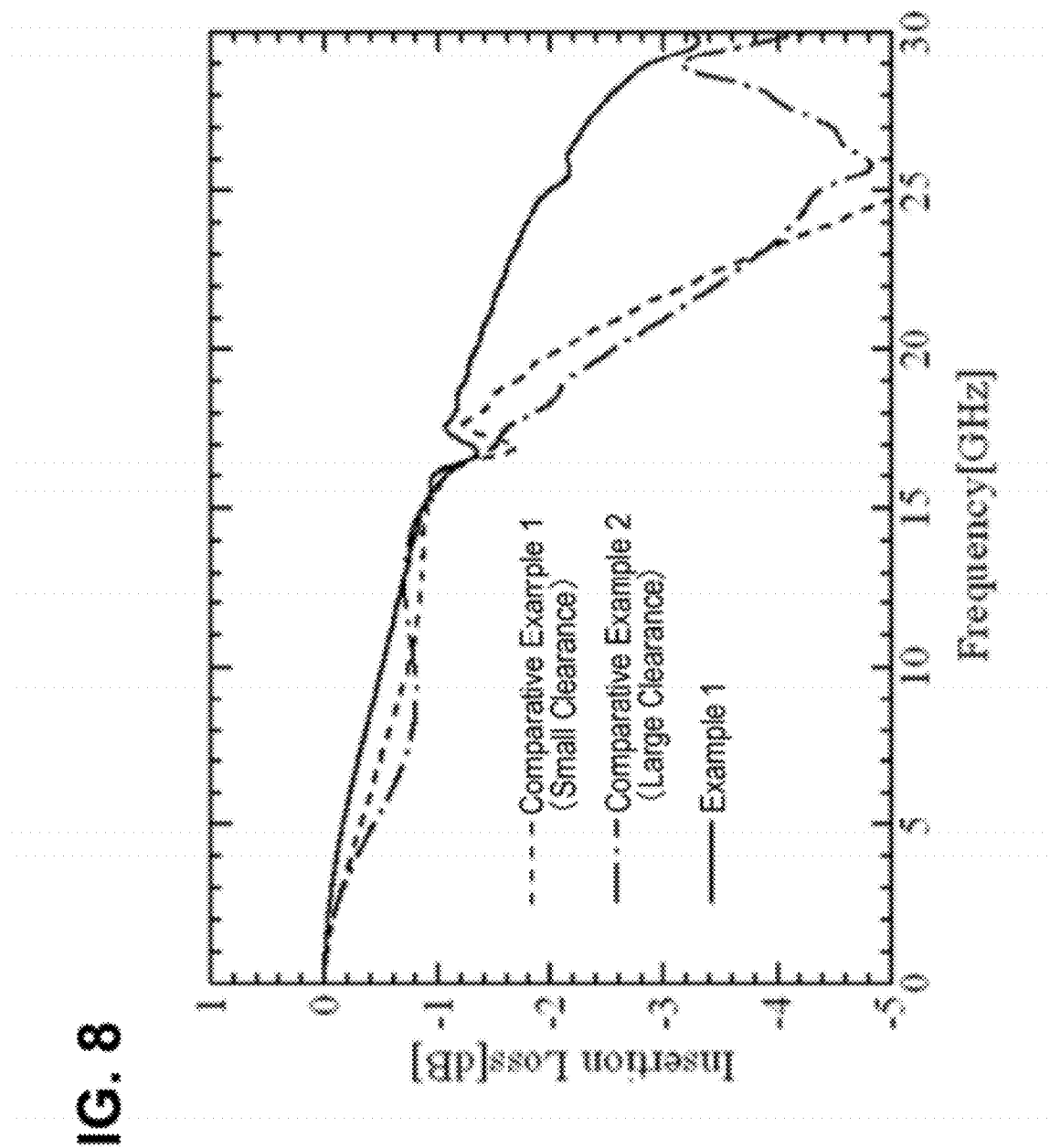

FIG. 8 is a graph illustrating transmission characteristics of each of the example 1, the comparative example 1, and the comparative example 2.

Figure 9:
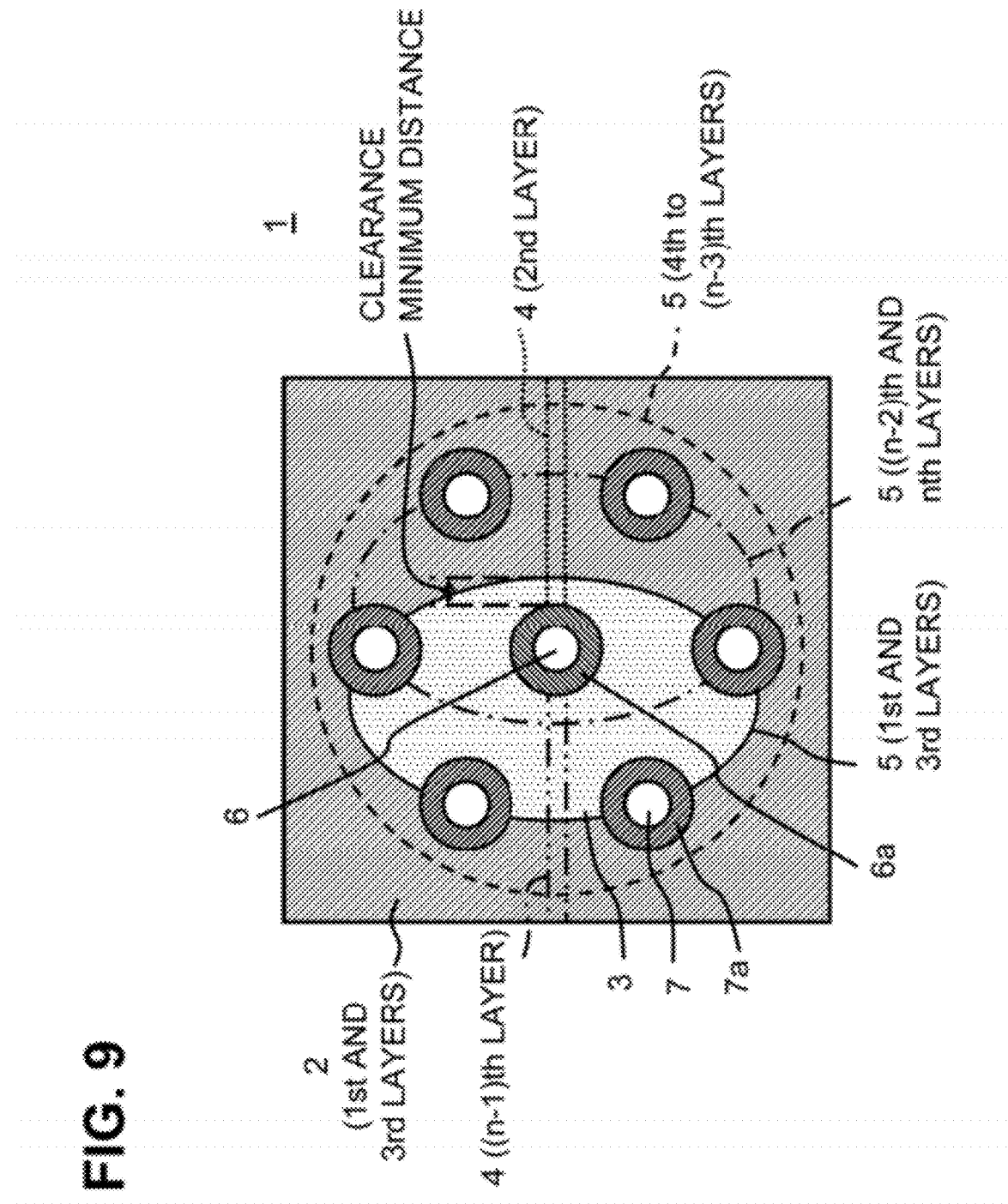

FIG. 9 is a schematic partial plan view illustrating an example of the structure around through holes of a printed wiring board according to example 2 of the present invention, seen from a first GND layer of the printed wiring board.

Figure 10:
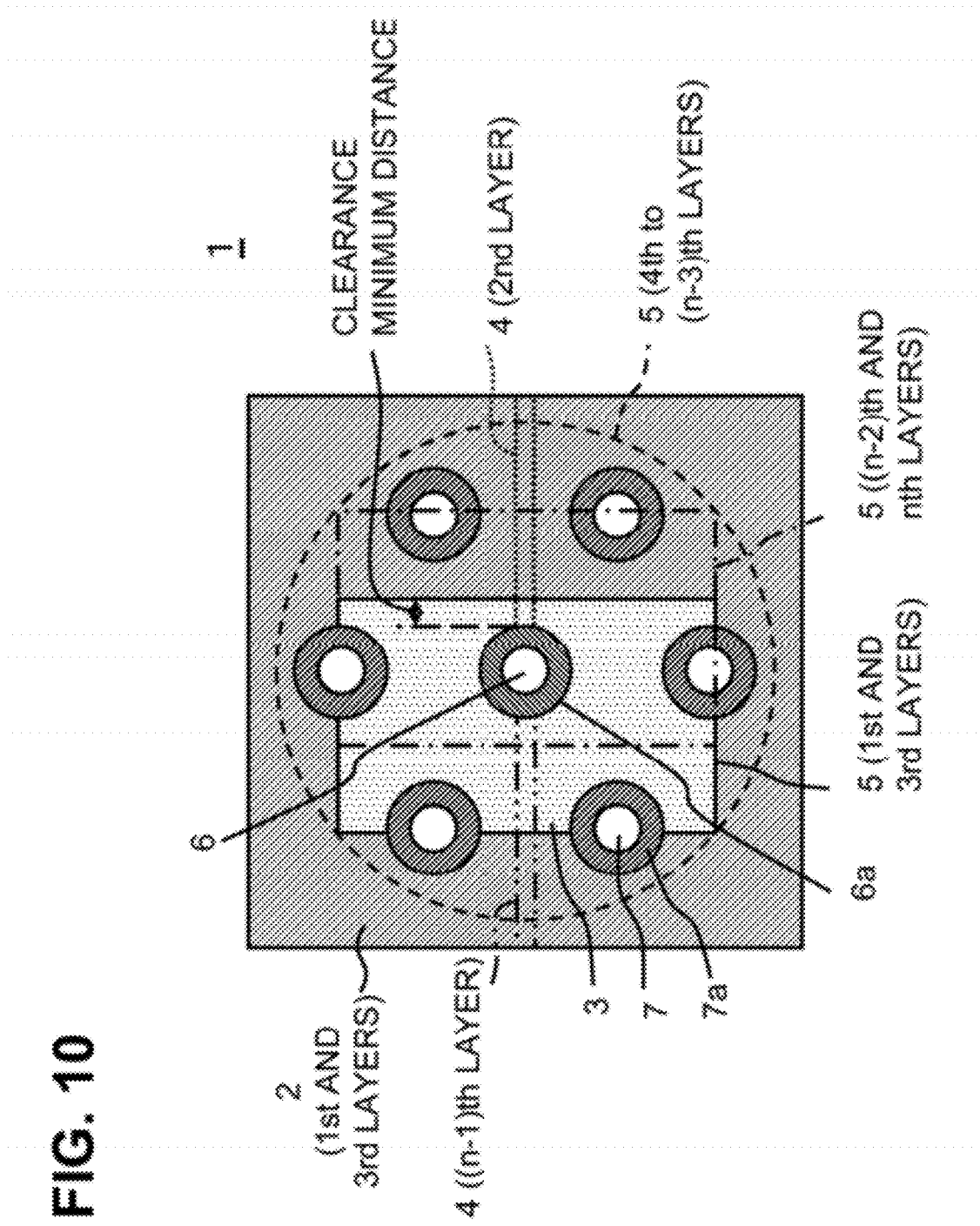

FIG. 10 is a schematic partial plan view illustrating an example of the structure around through holes of a printed wiring board according to example 3 of the present invention, seen from a first GND layer of the printed wiring board.

PREFERRED MODES

Figure 1:
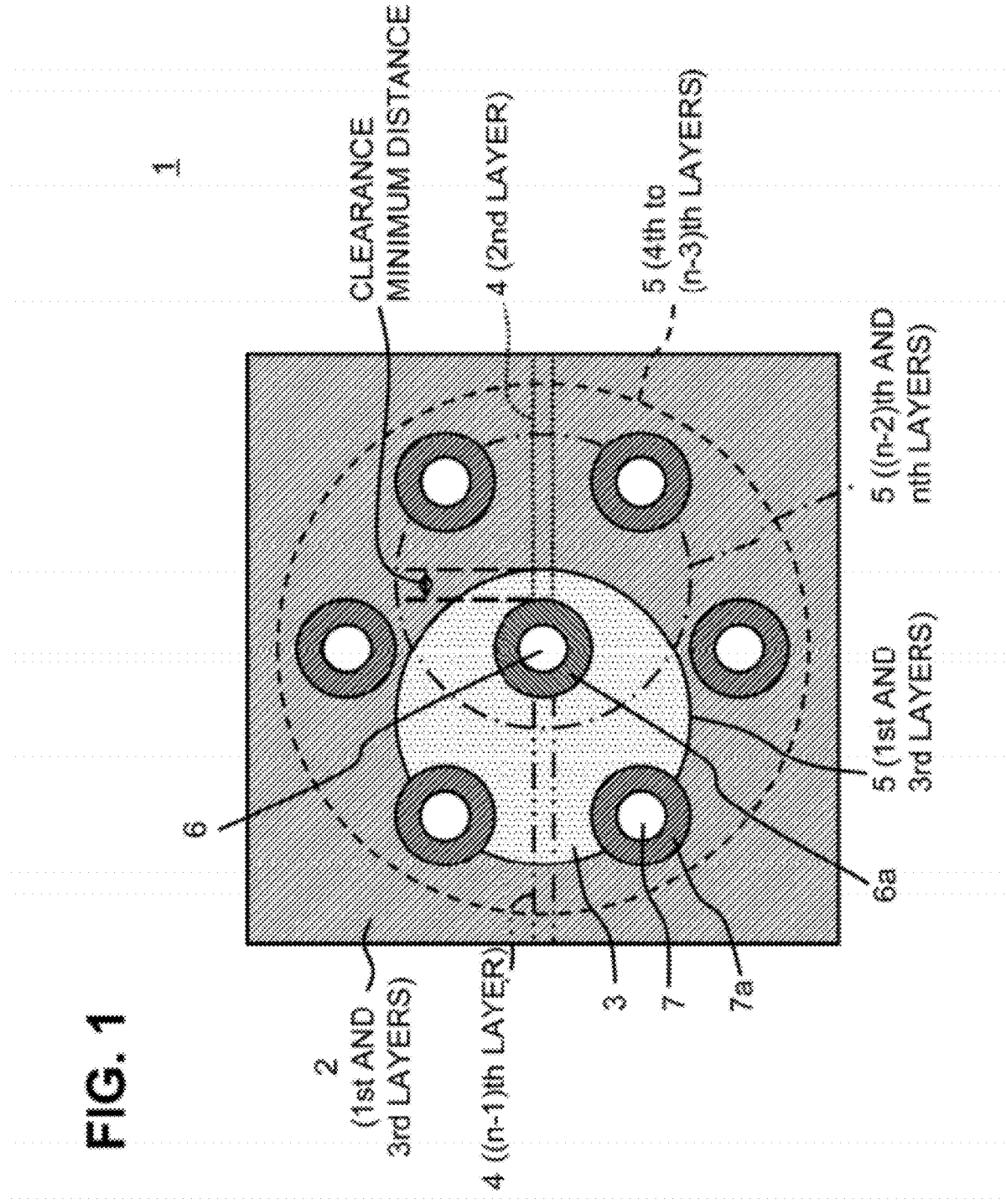
FIG. 1 is a schematic partial plan view illustrating an example of the structure around through holes of a printed wiring board according to an example 1 of the present invention, seen from a first GND layer of the printed wiring board.

A printed wiring board 1 (FIG. 1) of an exemplary embodiment of the present invention comprises: a plurality of ground layers 2 (FIG. 1) stacked via insulators 3 (FIG. 1); a first through hole 6 (FIG. 1); a plurality of second through holes 7 (FIG. 1) formed at predetermined positions along a circle concentric with a center axis of the first through hole 6 (FIG. 1); clearances 5 (FIG. 1), each forming an anti-pad, disposed in an area between the first through hole 6 (FIG. 1) and each of the ground layers 2 (FIG. 1); and signal wirings 4 (FIG. 2) each extending from the first through hole 6 (FIG. 1), through the clearance(s) 5 (FIG. 1) between predetermined ground layers 2 (between the GND layers 2 in the first and third layers as well as between the GND layers 2 in the (n-2) and nth layers in FIG. 2) of the ground layers, disposed between predetermined second through holes 7 among the second through holes 7 (FIG. 2). Among the clearances 5 (FIG. 1), the outline of each of first clearances 5 (FIG. 1) in the ground layers 2 (FIG. 1) one layer higher (the first and (n-2)th layers in FIG. 2) and one layer lower (the third and nth layers in FIG. 2) than the layer(s) in which the signal wiring 4 (FIG. 1) is disposed is formed so that the distance between the first through hole 6 (FIG. 1) and the outline of each of the first clearances 5 is minimum in a direction in which each of the signal wirings 4 (FIG. 1) extends from the first through hole 6 (FIG. 1). Further, among the clearances 5 (FIG. 2), the outline of each of second clearances 5 (FIG. 2) in the ground layers 2 (the GND layers 2 in the fourth to (n-3)th layers in FIG. 2) that are not adjacent to the signal wiring(s) 4 (FIG. 2) is formed outside a circle established by connecting each center of the second through holes 7 (FIG. 1) centering at a center axis of the first signal through hole 6 (FIG. 1), so that the outline of each of the second clearances 5 does not come into contact with the second through holes 7 (FIG. 1). The second through holes 7 (FIG. 2) are not connected to the ground layers 2 (the GND layers 2 in the fourth to the (n-3)th layers in FIG. 2) that are not adjacent to the signal wirings 4 (FIG. 2) but are connected to the ground layers 2 (FIG. 2) that are one layer higher (the first and (n-2)th layers in FIG. 2) and one layer lower (the third and nth layers in FIG. 2) than the respective layer(s) in which the signal wiring(s) 4 is disposed.

EXAMPLE 1

A printed wiring board according to example 1 of the present invention will be described with reference to drawings. FIG. 1 is a schematic partial plan view illustrating an example of the structure around through holes of a printed wiring board according to example 1 of the present invention, seen from a first GND layer of the printed wiring board. FIG. 2 is a partially perspective view illustrating an example of the structure of conducting parts around the through holes of the printed wiring board according to example 1 of the present invention. FIGS. 3A, 3B, and 3C schematically illustrate an example of the structure of the printed wiring board according to example 1 of the present invention: FIG. 3A is a sectional view illustrating a GND layer above a signal wiring; FIG. 3B is a sectional view illustrating the signal wiring layer; and FIG. 3C is a sectional view illustrating a GND layer below the signal wiring. FIG. 4 schematically illustrates an example of the structure of the printed wiring board according to example 1 of the present invention, illustrating a sectional view of a GND layer that is not adjacent to the signal wiring layer.

A printed wiring board 1 is a multilayered (laminate) wiring board in which GND layers 2 and insulators 3 are alternately stacked and each of the signal wirings 4 (the second and (n-1)th layers) is formed in the insulator 3 between predetermined GND layers 2 (see FIGS. 1 and 2). In this example, a multilayered printed board having n layers is used. The printed wiring board 1 has a clearance 5 as an opening in each of the GND layers 2, and each of the clearances 5 is filled with an insulator 3. The printed wiring board 1 comprises a signal through hole 6 penetrating the insulators 3 within each of the clearances 5. The signal through hole 6 is connected to the signal wirings 4 (in the second and (n-1)th layers). The printed wiring board 1 further comprises a plurality of GND through holes 7 (six holes in FIG. 1) penetrating the board and formed at predetermined positions along a circle concentric with the center axis of the signal through hole 6 at the center. The GND through holes 7 are connected to the GND layers 2 located one layer higher (the first and (n-2) layers) and one layer lower (the third and nth layers) than the layer(s) (the second and (n-1)th layers) in which the signal wiring(s) 4 is(are) disposed, respectively. The GND through holes 7 are not connected to the other GND layers 2 (the fourth to (n-3)th layers) (see FIGS. 3A-3C and FIG. 4). The outline of each of the clearances 5 in the GND layers 2 one layer higher (the first and (n-2)th layers) and one layer lower (the third and nth layers) than the layers (the second and (n-1)th layers) in which the signal wirings 4 are disposed is formed eccentrically with respect to the center axis of the signal through hole 6, so that the distance between the through hole 6 and the outline of each of the clearances 5 is minimum in a direction in which each of the signal wirings 4 extends from the through hole 6 (see FIGS. 3A-3C). The outline of each of the clearances 5 in the other GND layers 2 (the fourth to (n-3)th layers) is formed outside a circle connecting the each center of the GND through holes 7 centering at the center axis of the signal through hole 6, so that the outline of each of the clearances 5 does not come into contact with the GND through holes 7 (see FIG. 4).

The printed wiring board 1 comprises the GND layers 2, the insulators 3, the signal wirings 4, the clearances 5, the signal through hole 6, and the GND through holes 7.

The GND layers 2 are planar solid conductor layers made of copper or the like and connected to the GND. The GND layers 2 are stacked in multiple layers via the insulators 3. The signal wiring 4 in the second layer is formed between the GND layers 2 in the first and third layers via an insulator 3. Further, the signal wiring 4 in the (n-1)th layer is formed between the GND layers 2 in the (n-2)th and nth layers via the insulator 3. In each of the GND layers 2, a circular opening is formed at a position corresponding to each of the clearances 5 located around the signal through hole 6. The outline of each of the clearances 5 in the GND layers 2 one layer higher (the first and (n-2)th layers) and one layer lower (the third and nth layers) than the layer(s) (the second and the n-1 layers) in whith the signal wiring(s) 4 is (are) disposed is formed in a circular shape eccentrically with respect to the center axis of the signal through hole 6, so that the distance between the through hole 6 and the outline of each of the clearances 5 is minimum in a direction in which each of the signal wirings 4 extends from the through hole 6 (see FIGS. 3A-3C). The outline of each of the clearances S in the other GND layers 2 (the fourth to (n-3)th layers) is formed in a circular shape outside the circle formed by connecting each center of the GND through holes 7 centering at the axis of the signal through hole 6, so that the outline of each of the clearances 5 does not come into contact with the GND through holes 7 (see FIG. 4). Each of the clearances 5 in the GND layers 2 is filled with the insulator 3, and the signal through hole 6 penetrating the insulators 3 is formed in each of the clearances 5. The GND layers 2 one layer higher (the first and (n-2)th layers) and one layer lower (the third and nth layers) than (i.e. neighboring GND layers of) each of the layers (the second and (n-1)th layers) in which the signal wiring 4 is disposed are connected to the GND through holes 7 (see FIGS. 3A-3C). The other GND layers 2 (the fourth to (n-3)th layers) are not connected to the GND through holes 7 (see FIG. 4).

Each of the insulators 3 is made of insulating material such as epoxy resin and is disposed between two of the GND layers 2. One of the signal wirings 4 is disposed in the insulator 3 between the GND layers 2 in the first and third layers. The other signal wiring 4 is disposed in the insulator 3 between the GND layers 2 in the (n-2)th and nth layers. The insulator 3 is also disposed in (i.e. fills) the opening corresponding to the clearance 5 of each of the GND layers 2. A drilled hole is formed in each of the insulators 3 of the clearances 5, and the signal through hole 6 is formed on the wall surface of the drilled hole. The insulators 3 are provided with a plurality of drilled holes at predetermined positions along a circle concentric with the center axis of the signal through hole 6, and the GND through holes 7 are formed on the wall surfaces of the drilled holes.

The signal wirings 4 are made of a conductor such as copper or the like and used for signaling. One of the signal wirings 4 is formed in the insulator 3 between the GND layers 2 in the first and third layers, and the other signal wiring 4 is formed in the insulator 3 between the GND layers 2 in the (n-2)th and nth layers. Each of the signal wirings 4 is connected to the signal through hole 6 and has a land 4a formed (and connected) to the periphery of the signal through hole 6. Each of the signal wirings 4 extends between two of the GND through holes 7 neighboring each other.

Each of the clearances 5 is used as an anti-pad and disposed in an area between the signal through hole 6 and each of the GND layers 2. Each of the clearances 5 is filled with the insulator 3. The outline of each of the clearances 5 in the GND layers 2 one layer higher (the first and (n-2)th layers) and one layer lower (the third and nth layers) than the layers (the second and (n-1)th layers) in which the signal wirings 4 is (are) disposed is formed in a circular shape eccentrically with respect to the center axis of the signal through hole 6, so that the distance between the signal through hole 6 and the outline of each of the clearances 5 is minimum in a direction in which each of the signal wirings 4 extends from the signal through hole 6 (see FIGS. 3A-3C). The outline (outer contour) of each of the clearances 5 in the other GND layers 2 (the fourth to (n-3)th layers) is formed in a circular shape centering at the center axis of the signal through hole 6 outside the circle formed by connecting the center of each of the GND through holes 7, so that the outline of each of the clearances 5 does not come into contact with the GND through holes 7 (see FIG. 4). In other words, the outline of the clearance 5 extends spaced away from each of the GND through holes 7.

The signal through hole 6 is connected to a signal terminal (not shown) of a coaxial connector (not shown), and the signal through hole 6 is formed depending on the shape of the signal terminal (not shown) of the coaxial connector (not shown). The signal through hole 6 is made of a conductive material such as copper. The signal through hole 6 is formed on the wall surface of a drilled hole penetrating the insulators 3 in the clearances 5 and has lands 6a at the periphery of the upper surface and bottom surface thereof. The signal through hole 6 is also connected to the lands 4a of the signal wirings 4.

The GND through holes 7 are connected to a GND terminal (not shown) of a coaxial connector (not shown). The GND through holes 7 are formed depending on the shape of the GND terminal (not shown) of the coaxial connector (not shown). The GND through holes 7 are made of a conductor material such as copper. The GND through holes 7 are formed on the wall surfaces of the penetration drilled holes at predetermined places centering at the center axis of the signal through hole 6. The GND through holes 7 are connected to the GND layers 2 one layer higher (the first and (n-2)th layers) and one layer lower (the third and nth layers) than the layer(s) (the second and (n-1)th layers) in which the signal wiring(s) 4 is (are) disposed (see FIGS. 3A-3C). The GND through holes 7 are not connected to the other GND layers 2 of the other layers (the fourth to (n-3)th layers) (see FIG. 4).

Next, a method for manufacturing the printed wiring board according to example 1 of the present invention will be described.

First, the GND layer 2 in the first layer is formed on the rear surface of a sheet insulator 3. The GND layer 2 in the first layer has an opening as the clearance 5.

Next, the signal wiring 4 in the second layer is formed on the rear surface of the insulator 3. The signal wiring 4 in the second layer has a land 4a (see FIG. 3B). The land 4a is disposed at a position eccentric from the center of the clearance 5 in the GND layer 2 in the first layer. The signal wiring 4 in the second layer is formed to extend from the center of the land 4a toward the nearest outline of the clearance 5 in the GND layer 2 in the first layer.

Next, another insulator 3 is formed on the insulator 3 including the signal wiring 4 in the second layer, and the GND layer 2 in the third layer is formed on the surface of the formed insulator 3. The GND layer 2 in the third layer has a clearance 5 identical to the clearance 5 of the GND layer 2 in the first layer.

Next, another insulator 3 is formed on the insulator 3 including the GND layer 2 in the third layer, and the GND layer 2 in the fourth layer is formed on the surface of the formed insulator 3. The GND layer 2 in the fourth layer has an opening as a clearance 5 larger than the clearance 5 of the GND layer 2 in the third layer and concentric with the land 4a of the signal wiring 4 in the second layer. The clearance 5 of the GND layer 2 in the fourth layer is disposed to encompass the clearance 5 of the GND layer 2 in the third layer. The center of the clearance 5 of the GND layer 2 in the fourth layer does not register with the center of the clearance 5 of the GND layer 2 in the first and third layers.

Next, another insulator 3 is formed on the insulator 3 including the GND layer 2 in the fourth layer, and a GND layer 2 in the fifth layer is formed on the surface of the formed insulator 3. This process is repeated until the GND layer 2 in the (n-3)th layer is formed. Each of the GND layers 2 in the fifth to (n-3)th layers has an opening as the clearance 5 identical to the clearance 5 of the GND layer 2 in the fourth layer.

Next, another insulator 3 is formed on the insulator 3 including the GND layer 2 in the (n-3)th layer, and a GND layer 2 in the (n-2)th layer is formed on the surface of the formed insulator 3. The GND layer 2 in the (n-2)th layer has an opening as the clearance 5 smaller than the clearance 5 of the GND layer 2 in the (n-3)th layer, and the center of the clearance 5 does not register with the center of the clearance 5 of the GND layer 2 in the fourth layer.

Next, another insulator 3 is formed on the insulator 3 including the GND layer 2 in the (n-2)th layer, and a signal wiring 4 in the (n-1)th layer is formed on the surface of the formed insulator 3. The signal wiring 4 in the (n-1)th layer has a land 4a (see FIG. 3B). The land 4a is disposed to in register with the center of the land 4a of the signal wiring 4 in the second layer and is disposed eccentrically with respect to the center of the clearance 5 of the GND layer 2 in the (n-2)th layer. The signal wiring 4 in the (n-1)th layer is formed to extend from the center of the land 4a toward the nearest outline of the clearance 5 in the GND layer 2 in the (n-2)th layer.

Next, another insulator 3 is formed on the insulator 3 including the signal wiring 4 in the (n-1)th layer, and a GND layer 2 in the nth layer is formed on the surface of the formed insulator 3. The GND layer 2 in the nth layer has a clearance 5 identical to the clearance 5 of the GND layer 2 in the (n-2)th layer.

Next, holes for the signal through hole 6 and the GND through holes 7 are formed at predetermined positions of the board. The hole for the signal through hole 6 is formed to penetrate the lands 4a of the signal wirings 4 in the (n-1)th and second layers. The holes for the GND through holes 7 are formed at predetermined positions on a circle concentric with the hole for the signal through hole 6. The holes for the GND through holes 7 do not come into contact with the signal wirings 4 in the second and (n-1)th layers. The holes for the GND through holes 7 do not penetrate the GND layers 2 in the fourth to (n-3)th layers but they penetrate the GND layers 2 in the first, third, (n-2)th, and nth layers.

Finally, the signal through hole 6 and the GND through holes 7 are formed on the wall surfaces of the holes for the signal through hole 6 and the GND through holes 7. Thus, a printed wiring board that is the same as that shown in FIG. 1 is made.

Next, the operation of the printed wiring board according to the example 1 of the present invention will be described.

In general, characteristic impedance $Z_0$ of a coaxial structure is calculated by the following mathematical formula (1).

$$Z_0 = \frac{60}{\sqrt{\varepsilon_r}} \log \frac{b}{a}. \quad (1)$$

Using the above mathematical formula (1), the characteristic impedance $Z_0$ can be determined by the radius "a" of a core (inner conductor) and the inner radius "b" of an external conductor alone. The "$\varepsilon_r$" is a dielectric constant and "log" is the natural logarithm.

In the example 1, the GND through holes 7 are formed in a concentric fashion around the signal through hole 6. This structure is similar to a coaxial structure and can be regarded as a quasi-coaxial structure. By substituting a drill diameter R1 of the signal through hole 6 as the radius "a" and a radius R2 of a concentric circle formed by the GND through holes 7 as the inner radius "b" into the above mathematical formula 1, characteristic impedance of the through holes of a coaxial connector can be predicted.

Regarding the clearance 5, deviation of impedance design values is caused by electromagnetic coupling between the signal through hole 6 and the GND layers 2, and as a result, characteristic degradation is caused. Thus, in order to block such coupling between the GND layers 2 and the signal through hole 6, the outline of the clearance 5 of each of the GND layers 2 in the fourth to (n-3)th layers is extended to an outer side of the circle formed by connecting the center of each of the GND through holes 7. Thus, since the electromagnetic coupling from the GND layers 2 is blocked, impedance design can be carried out by the signal through hole 6 and the GND through holes 7 alone.

While each of the signal wirings 4 is extended (led out) from the signal through hole 6, since the signal wirings 4 extend on (i.e. pass by) the clearances 5, impedance characteristics may deteriorate. In order to address this problem, the area of each of the clearances 5 in the GND layers 2 one layer higher (the first and (n-2)th layers) and one layer lower (the third and nth layers) than the layers (the second and (n-1)th layers) in which the signal wiring(s) 4 is(are) disposed is formed eccentrically with respect to the center the axis of the signal through hole 6, so that the signal wirings 4 extends on (pass by) the clearances 5 at a minimum length (distance). Thus, mismatching of the characteristic impedance of the signal wirings 4 is made smaller, thereby improving the transmission characteristics.

Next, characteristics of the printed wiring board according to example 1 of the present invention will be described with comparative examples and drawings. FIG. 5 is a schematic partial plan view illustrating an example of the structure around through holes of a printed wiring board according to a comparative example 1, seen from a first GND layer of the printed wiring board. FIG. 6 is a schematic partial plan view illustrating an example of the structure around through holes of a printed wiring board according to a comparative example 2, seen from a first GND layer of the printed writing board. FIG. 7 is a graph illustrating characteristic impedance of each of example 1, comparative example 1, and comparative example 2. FIG. 8 is a graph illustrating transmission characteristics of each of example 1, comparative example 1, and comparative example 2.

Characteristic impedance of the signal through hole 6 and the GND through holes 7 is the same between example 1, comparative example 1, and comparative example 2; the only difference between the examples is the clearances. As shown in FIG. 5, each of the clearances 5 of the printed wiring board according to comparative example 1 is formed in a circular shape centering at the center axis of the signal through hole 6. The outline of the clearance 5 is located inside the circle formed by connecting the center of each of the GND through holes 7 so that the outline of the clearance 5 does not come into contact with the GND through holes 7. The clearances 5 are connected to the GND through holes 7 and each of the GND layers 2. As shown in FIG. 6, each of the clearances 5 of the printed wiring board according to the comparative example 2 is formed in a circular shape centering at the center axis of the signal through hole 6. The outline of the clearance 5 corresponds to a circle formed by connecting the center of each of the GND through holes 7 so that each of the clearances 5 comes into contact with the GND through holes 7. The clearances 5 are connected to the GND through holes 7 and each of the GND layers 2. Other than the clearance 5, comparative examples 1 and 2 have the same structure as example 1.

FIG. 7 shows a graph plotted based on TDR (Time Domain Reflectmetry) in which characteristic impedance is indicated over time. It shows that the more stable 50Ω, the better is the characteristic impedance. If the clearances are small as those of comparative example 1 (see FIG. 5), the impedance of the through holes decreases. If the clearances are large as those of comparative example 2 (see FIG. 6), the impedance increases. In contrast, by formulating the clearances likewise the clearances 5 of example 1 (see FIG. 1), the characteristic impedance stabilizes. Thus, it is found that the inventive example is superior to the comparative examples 1 and 2.

FIG. 8 shows insertion loss, and the insertion loss plotted lower in the graph represents greater attenuation and poorer transmission characteristics. The data also shows that the transmission characteristics degrade regardless of the size of the clearances. However, by making clearances likewise the clearances 5 of example 1 (see FIG. 1), the attenuation is reduced in a higher frequency range. Therefore, it is found that the transmission characteristics of example are superior to those of the comparative examples 1 and 2.

Based on the printed wiring board 1 of example 1, the clearances 5, that have been, conventionally a cause of degradation of signal transmission characteristics, are improved, and thus, high-quality, high-speed signal transmission is achieved. In addition, even when through holes have to be used in high-density multilayer wirings, matching of the characteristic impedance of the signal wirings 4 and reduction of the insertion loss are achieved, and therefore, products can be designed without degradation of characteristics.

According to Patent Document 3, a bandstop filter is formulated by disposing a conductor via near a signal via. Thus, this document is directed to obtaining effects opposite to those of the present example in which broadband transmission is assumed.

Patent Document 4 discloses a multilayer printed board, and according to the document, magnetic material is provided around a via hole to form a common mode filter. However, this document is different from the present example in both configuration method and object.

Patent Document 5 discloses a multilayer printed circuit board, and according to this document, high-dielectric material is embedded around the penetration vias of the signal wirings, aiming to suppress electromagnetic interference (EMI). However, it is silent of impedance control for the penetration vias of the signal wirings, i.e. unclear.

Patent Document 6 discloses a printed wiring board, and according to this document, characteristics are improved by providing a clearance of a through hole with an impedance gradient area. However, since mismatching of the impedance of a signal wiring on the clearance is caused, degradation of characteristics may be caused in a high frequency range.

In addition, Patent Document 7 discloses a multilayer printed wiring board. According to this document, capacitance and inductance is calculated based on the shape of a signal-transmission through hole, and characteristic impedance is calculated to set a hole diameter. However, the capacitance and inductance attributable to coupling between through holes and GND or power-supply solid conductors are not considered.

In addition, Patent Document 8 discloses a multilayer printed wiring board. According to this document, capacitance and inductance are calculated based on the shape of a through hole for differential transmission signal, and characteristic impedance is calculated to set a hole diameter. However, as in Patent Document 7, the capacitance and inductance attributable to coupling between through holes and GND or planar solid conductors of the power-supply-layer are not considered.

In addition, Patent Document 9 discloses a multilayer wiring board. According to this document, in order to suppress electromagnetic coupling between through holes and power-supply patterns or ground patterns, only the clearances for the ground patterns adjacent to the signal wiring patterns are made smaller, and the clearances for the other power-supply patterns or ground patterns are made larger. However, no method for suppressing electromagnetic coupling at the smaller clearance portions is disclosed. Further, no technique for controlling the impedance of the through holes is disclosed.

EXAMPLE 2

A printed wiring board according to example 2 of the present invention will be described with reference to drawings. FIG. 9 is a schematic partial plan view illustrating an example of the structure around through holes of a printed wiring board according to the example 2 of the present invention, seen from a first GND layer of the printed wiring board.

In the printed wiring board 1 according to example 2, an outline of each of the clearances 5 in the GND layers 2 one layer higher (the first and (n-2)th layers) and one layer lower (the third and nth layers) than each of the layers (the second and (n-1)th layers) in which the signal wirings 4 are disposed is formed in an elliptical (or oval) shape eccentrically with respect to the center axis of the signal through hole 6, so that the distance between the signal through hole 6 and the outline of each of the clearances 5 is minimum in a direction in which each of the signal wirings 4 extends from the signal through hole 6. Example 2 is the same as example 1 in other aspects and provides similar effects as example 1.

EXAMPLE 3

A printed wiring board according to example 3 of the present invention will be described with reference to drawings. FIG. 10 is a schematic partial plan view illustrating an example of the structure around through holes of a printed wiring board according to example 3 of the present invention, seen from a first GND layer of the printed wiring board.

In the printed wiring board 1 according to example 3, the outline of each of the clearances 5 in the GND layers 2 one layer higher (the first and (n-2)th layers) and one layer lower (the third and nth layers) than each of the layers (the second and (n-1)th layers) in which the signal wiring(s) 4 is (are) disposed is formed in a square (or polygonal) shape eccentrically with respect to the center axis of the signal through hole 6, so that the distance between the signal through hole 6 and the outline of each of the clearances 5 is minimum in a direction in which each of the signal wirings 4 extends from the signal through hole 6. Example 3 is the same as example 1 in other aspects and provides similar effects as example 1.

In the present invention, the following modes are possible.
Mode 1. As set forth as the first aspect.
Mode 2.
The outline of each of the first clearances may be formed in a circular shape eccentrically with respect to the center axis of the first through hole.
Mode 3.
The outline of each of the first clearances may be formed in an elliptical or oval shape eccentrically with respect to the center axis of the first through hole.
Mode 4.
The outline of each of the first clearances may be formed in a polygonal shape eccentrically with respect to the center axis of the first through hole.
Mode 5. As set forth in the second aspect.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A method for manufacturing a printed wiring board, the method comprising:
    forming a first ground layer directly on a first surface of a first insulator, the first layer having a first opening;
    forming a signal wiring directly on a second surface opposite to the first surface of the first ground layer, the signal wiring extending from a predetermined position eccentrically with respect to a center of the first opening in a direction of a nearest outline part of the first opening to the predetermined position when viewing from directly above the second surface of the first insulator;
    forming a second insulator directly on the signal wiring and the second surface of the first insulator;
    forming a second ground layer directly on the second insulator, the second ground layer having a second opening at a position same as that of the first opening and having a shape same as that of the first opening when viewing from directly above the second insulator;
    forming a third insulator directly on the second insulator and the second ground layer;
    forming a third ground layer directly on the third insulator, the third ground layer having a third opening that has a larger area than the second opening and centering a position same as the predetermined position when viewing from directly above the third insulator;
    forming a first penetration hole penetrating the predetermined position;
    forming second penetration holes disposed in a plurality of positions on a line of a virtual circle of a predetermined radius concentric with a center axis of the first opening and penetrating the first and the second ground layers without directly contacting with the signal wiring and the third ground layer when viewing from directly above the third ground layer; and
    forming a first through hole and second through holes in the first and the second penetration holes, respectively.

* * * * *